(12) United States Patent
Kim

(10) Patent No.: US 12,243,818 B2
(45) Date of Patent: Mar. 4, 2025

(54) MEMORY DEVICE AND METHOD OF MANUFACTURING THE SAME

(71) Applicant: SK hynix Inc., Icheon-si (KR)

(72) Inventor: Jin Ha Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 548 days.

(21) Appl. No.: 17/552,944

(22) Filed: Dec. 16, 2021

(65) Prior Publication Data

US 2023/0035588 A1 Feb. 2, 2023

(30) Foreign Application Priority Data

Jul. 30, 2021 (KR) .................. 10-2021-0100874

(51) Int. Cl.
| | | |
|---|---|---|
| H01L 23/528 | (2006.01) | |
| H01L 23/532 | (2006.01) | |
| H01L 23/535 | (2006.01) | |
| H10B 41/27 | (2023.01) | |
| H10B 43/27 | (2023.01) | |

(52) U.S. Cl.
CPC .... *H01L 23/5283* (2013.01); *H01L 23/53266* (2013.01); *H01L 23/535* (2013.01); *H10B 41/27* (2023.02); *H10B 43/27* (2023.02)

(58) Field of Classification Search
CPC ........... H01L 23/5283; H01L 23/53266; H01L 23/535; H01L 29/7926; H10B 41/27; H10B 41/35; H10B 41/40; H10B 43/27; H10B 43/35; H10B 43/40; H10B 43/50
See application file for complete search history.

(56) References Cited

U.S. PATENT DOCUMENTS

| | | | |
|---|---|---|---|
| 8,729,622 B2 | 5/2014 | Moon et al. | |
| 9,166,032 B1* | 10/2015 | Higuchi | ............ H01L 29/7785 |
| 10,109,643 B2* | 10/2018 | Arai | .............. H10B 43/20 |
| 10,510,590 B2 | 12/2019 | Thombare et al. | |
| 10,559,584 B2* | 2/2020 | Choi | ................. H01L 29/4234 |
| 10,600,801 B2* | 3/2020 | Lee | .............. H10B 43/10 |
| 2014/0256101 A1* | 9/2014 | Moon | ................ H10B 43/27 |
| | | | 438/268 |
| 2016/0013201 A1* | 1/2016 | Higuchi | ................ H10B 41/10 |
| | | | 257/314 |

* cited by examiner

*Primary Examiner* — Brook Kebede
(74) *Attorney, Agent, or Firm* — WILLIAM PARK & ASSOCIATES LTD.

(57) ABSTRACT

A memory device, and a method of manufacturing the same, includes interlayer insulation layers spaced apart from each other and stacked, gate lines formed between the interlayer insulation layers, and a plug vertically passing through the interlayer insulation layers and the gate lines. Each of the gate lines includes a barrier layer formed along an inner wall of the interlayer insulation layer and the plug, a first conductive layer surrounded by the barrier layer, and a second conductive layer surrounded by the first conductive layer. A material of the second conductive layer is different from a material of the first conductive layer, and a size of the second conductive layer is variable along a direction in which the gate lines extend.

25 Claims, 15 Drawing Sheets

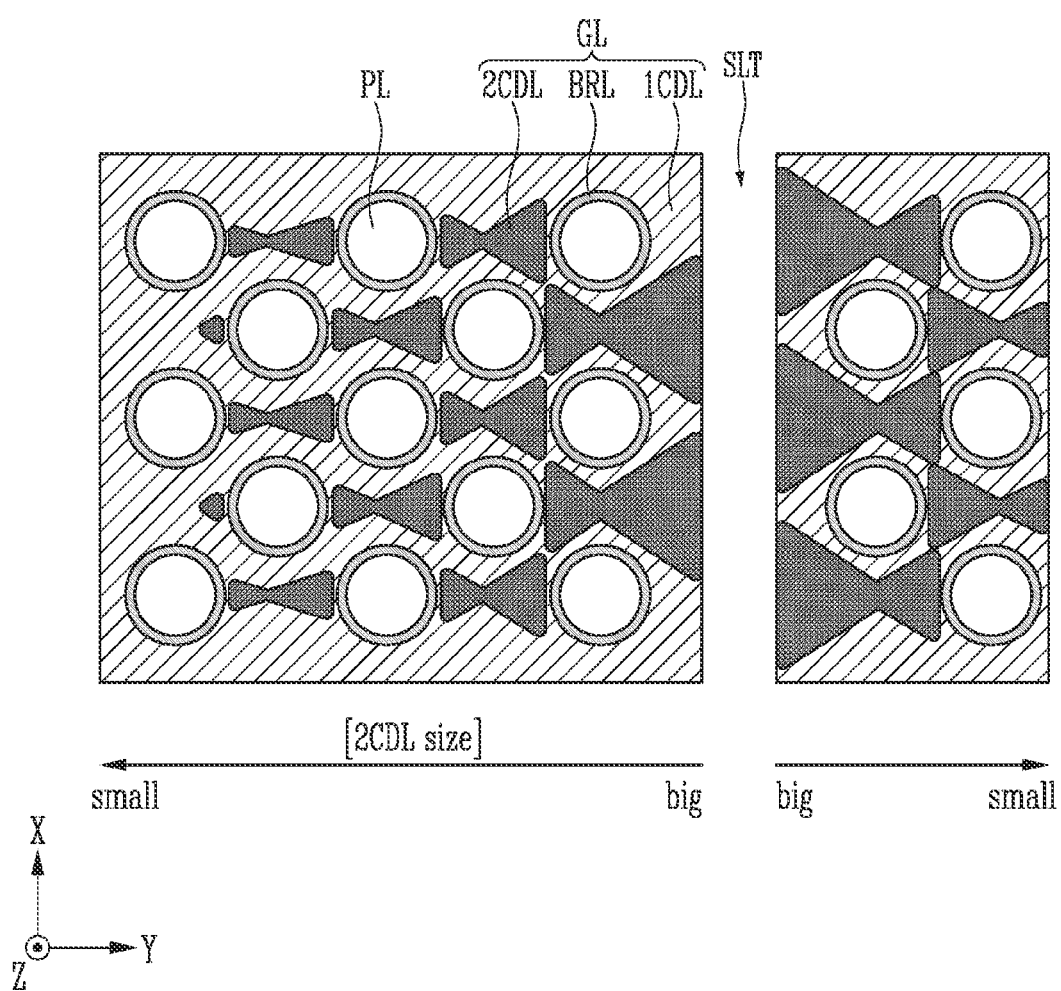

MEMORY DEVICE AND METHOD OF MANUFACTURING THE SAME

CROSS-REFERENCE TO RELATED APPLICATION

The present application claims priority under 35 U.S.C. § 119(a) to Korean patent application number 10-2021-0100874 filed on Jul. 30, 2021, in the Korean Intellectual Property Office, the entire disclosure of which is incorporated by reference herein.

BACKGROUND

1. Field of Invention

The present disclosure relates to a memory device and a method of manufacturing the same, and more particularly, to a memory device capable of reducing a resistance of word lines included in the memory device, and a method of manufacturing the same.

2. Description of Related Art

A memory device may be classified as a volatile memory device for which stored data is lost when supplied power is interrupted or a non-volatile memory device for which stored data is maintained even when supplied power is interrupted.

A non-volatile memory device may include NAND flash memory, NOR flash memory, resistive random access memory (ReRAM), phase-change random access memory (PRAM), magnetoresistive random access memory (MRAM), ferroelectric random access memory (FRAM), spin transfer torque random access memory (STT-RAM), or the like.

Memory cells included in the NAND flash memory may be connected between word lines and bit lines, and may be programmed or read according to a voltage applied to the word lines and the bit lines. As an integration degree of the memory device increases, a side of the word lines decreases, and thus the difficulty of manufacturing the memory device increases.

SUMMARY

An embodiment of the present disclosure provides a memory device and a method of manufacturing the same for preventing a void, an air gap, or a seam from being formed in word lines during a manufacturing process of the memory device.

According to an embodiment of the present disclosure, a memory device includes interlayer insulation layers spaced apart from each other and stacked, gate lines formed between the interlayer insulation layers, and a plug vertically passing through the interlayer insulation layers and the gate lines. Each of the gate lines includes a barrier layer formed along an inner wall of the interlayer insulation layer and the plug, a first conductive layer surrounded by the barrier layer, and a second conductive layer surrounded by the first conductive layer. A material of the second conductive layer is different from a material of the first conductive layer, and a size of the second conductive layer is variable along a direction in which the gate lines extend.

According to an embodiment of the present disclosure, a memory device includes interlayer insulation layers and gate lines alternately stacked on each other, plugs vertically passing through the interlayer insulation layers and the gate lines, and a first slit separating the interlayer insulation layers and the gate lines to separate different memory blocks. Each of the gate lines includes a barrier layer, a first conductive layer surrounded by the barrier layer, and a second conductive layer surrounded by the first conductive layer. A size of the second conductive layer increases with decreasing distance of the second conductive layer from the first slit.

According to an embodiment of the present disclosure, a method of manufacturing a memory device includes alternately stacking interlayer insulation layers and sacrificial layers on a lower structure, forming plugs vertically passing through the interlayer insulation layers and the sacrificial layers, forming a slit vertically passing through the interlayer insulation layers and the sacrificial layers in a boundary area between different memory blocks, removing the sacrificial layers exposed through a sidewall of the slit, forming a first conductive layer in an area from which the sacrificial layers are removed, and filling a void generated when the first conductive layer is formed with a second conductive layer. A material of the second conductive layer is different from a material of the first conductive layer.

According to an embodiment of present disclosure, a void, an air gap, or a seam may be prevented from being formed in word lines, and a resistance of the word lines may be reduced. Therefore, reliability of the display device may be improved.

BRIEF DESCRIPTION OF THE DRAWINGS

FIG. 5 is a plan view illustrating a memory device according to an embodiment of the present disclosure.

DETAILED DESCRIPTION

Specific structural or functional descriptions of embodiments disclosed in the present specification or application are illustrated to describe the concept of the present disclosure. Embodiments according to the concept of the present disclosure may be carried out in various forms and should not be construed as being limited to the presented embodiments.

Figure 1:
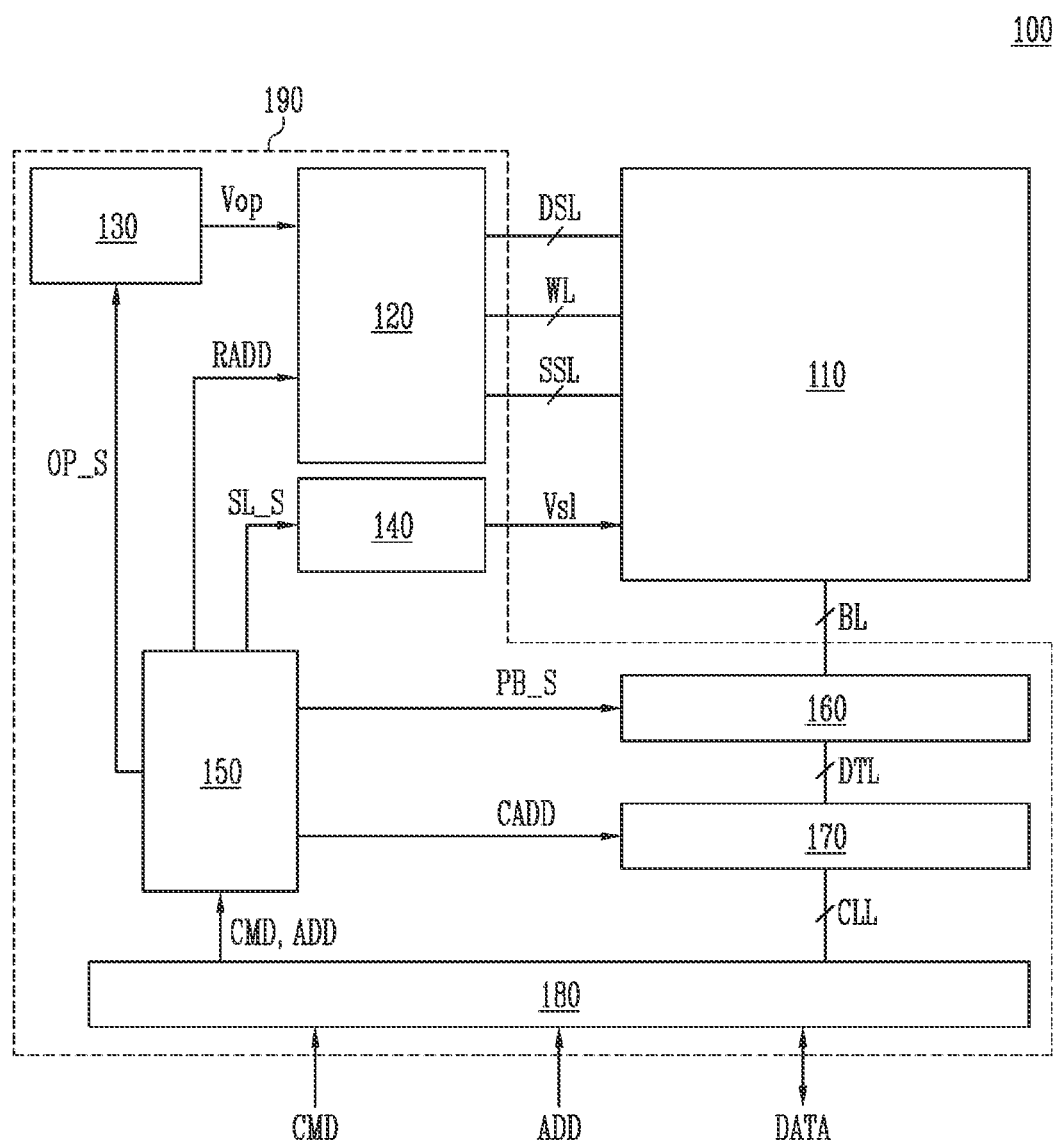
FIG. 1 is a block diagram illustrating a memory device according to an embodiment of the present disclosure.

FIG. 1 is a block diagram illustrating a memory device according to an embodiment of the present disclosure.

Referring to FIG. 1, the memory device 100 may include a peripheral circuit 190 and a memory cell array 110.

The peripheral circuit 190 may be configured to perform a program operation and a verify operation for storing data in the memory cell array 110, a read operation for outputting data stored in the memory cell array 110, or an erase operation for erasing data stored in the memory cell array 110. The peripheral circuit 190 may include a voltage generating circuit 130, a row decoder 120, a source line driver 140, a control circuit 150, a page buffer 160, a column decoder 170, and an input-output circuit 180.

The memory cell array 110 may include a plurality of memory cells in which data is stored. In an embodiment, the memory cell array 110 may be a three-dimensional memory cell array. The plurality of memory cells may store single bit or multi bit data of two or more bits according to a program method. The plurality of memory cells may configure a plurality of memory cell strings. Each memory cell string may include a plurality of memory cells connected in series to each other through a channel structure. The channel structure may be connected to the page buffer 160 through a plurality of bit lines BL.

The voltage generating circuit 130 may generate various operation voltages Vop used for the program operation, the verify operation, the read operation, or the erase operation in response to an operation signal OP_S. For example, the voltage generating circuit 130 may selectively generate and output the operation voltages Vop including a program voltage, a verify voltage, a pass voltage, a read voltage, and an erase voltage.

The row decoder 120 may be connected to the memory cell array 110 through a plurality of drain select lines DSL, a plurality of word lines WL, and a plurality of source select lines SSL. The row decoder 120 may transmit the operation voltages Vop to the plurality of drain select lines DSL, the plurality of word lines WL, and the plurality of source select lines SSL in response to a row address RADD.

The source line driver 140 may transmit a source voltage Vsl to the memory cell array 110 in response to a source line control signal SL_S. For example, the source voltage Vsl may be transmitted to a source line connected to the memory cell array 110.

The control circuit 150 may output the operation signal OP_S, the row address RADD, the source line control signal SL_S, a page buffer control signal PB_S, and a column address CADD, in response to a command CMD and an address ADD.

The page buffer 160 may be connected to the memory cell array 110 through the bit line BL. The page buffer 160 may temporarily store data DATA received through the plurality of bit lines BL in response to the page buffer control signal PB_S. The page buffer 160 may sense a voltage or a current of the plurality of bit lines BL during the read operation.

The column decoder 170 may transmit the data DATA input from the input-output circuit 180 to the page buffer 160 in response to the column address CADD, or transmit the data DATA stored in the page buffer 160 to the input-output circuit 180. The column decoder 170 may transmit and receive the data DATA to and from the input-output circuit 180 through column lines CLL, and may transmit and receive the data DATA to and from the page buffer 160 through data lines DTL.

The input-output circuit 180 may transmit the command CMD and the address ADD received from an external device (for example, a controller) connected to the memory device 100 to the control circuit 150, and output the data received from the column decoder 170 to the external device.

Figure 2:
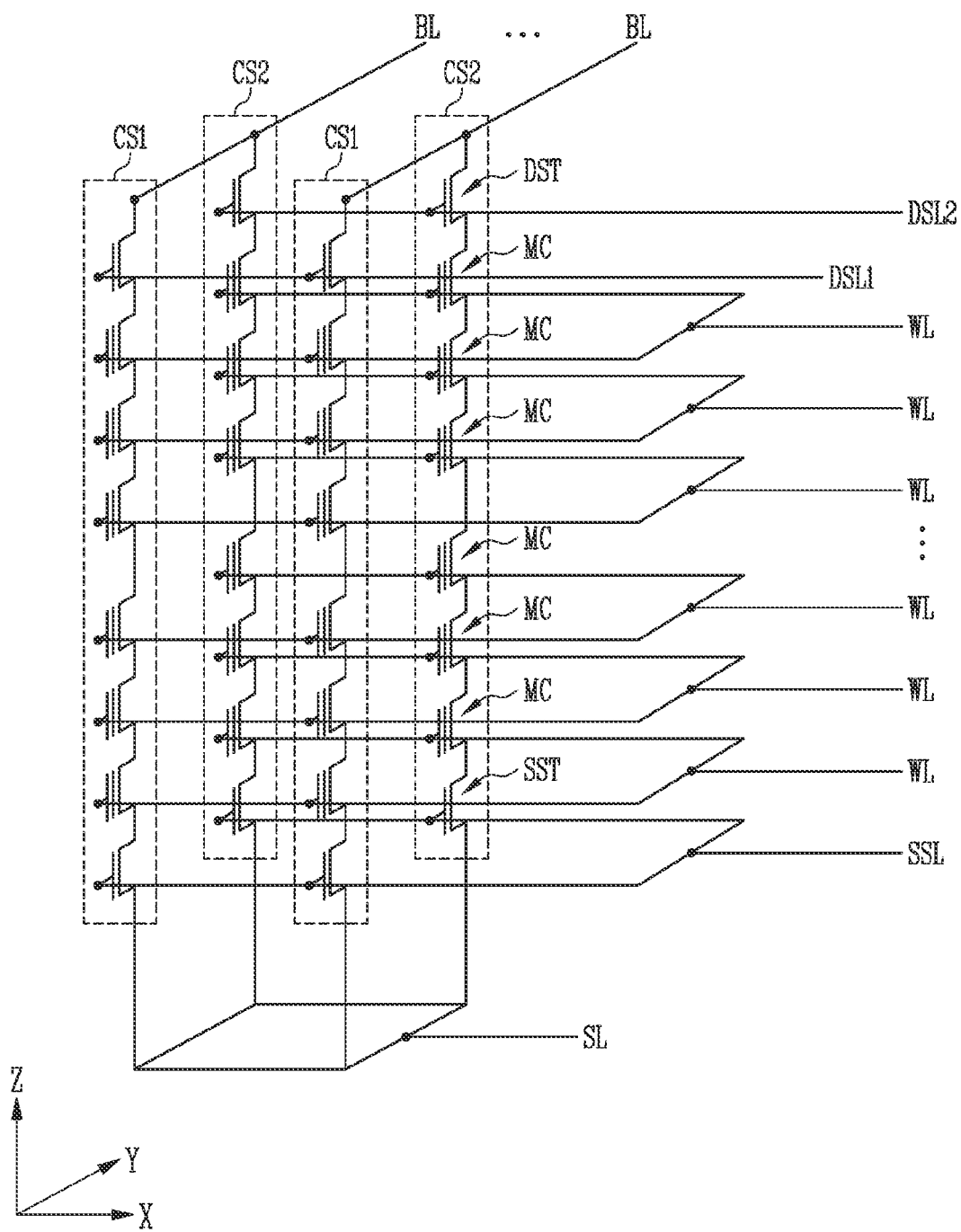
FIG. 2 is a circuit diagram illustrating an embodiment of a memory cell array shown in FIG. 1.

FIG. 2 is a circuit diagram illustrating an embodiment of the memory cell array shown in FIG. 1.

Referring to FIG. 2, the memory cell array may include first and second memory cell strings CS1 and CS2 connected to the plurality of bit lines BL. The first and second memory cell strings CS1 and CS2 may be commonly connected to the source line SL. That is, the first and second memory cell strings CS1 and CS2 may be connected between the bit lines BL and the source line SL. At least a pair of the first memory cell string CS1 and the second memory cell string CS2 may be connected to each of the bit lines BL.

The first memory cell string CS1 and the second memory cell string CS2 may include a source select transistor SST, a plurality of memory cells MC, and a drain select transistor DST disposed between the source line SL and the bit line BL. The first and second memory cell strings CS1 and CS2 may be arranged to be spaced apart from each other in first and second directions (X and Y directions), and may extend in a third direction (Z direction). For example, the first and second directions (X and Y directions) may be directions parallel to a substrate, and the third direction (Z direction) may be a direction perpendicular to the substrate. The first, second, and third directions (X, Y, and Z directions) may be perpendicular to each other.

The source select transistors SST may control an electrical connection between the plurality of memory cells MC and the source line SL. Although the figure shows that one source select transistor SST is included in one memory cell string, two or more source select transistors connected in series may be included in one memory cell string. Gates of the source select transistors SST may be connected to the source select line SSL. The source select transistors SST may be turned on or turned off according to a voltage applied to the source select line SSL.

The plurality of memory cells MC may be connected between the source select transistor SST and the drain select transistor DST. The plurality of memory cells MC between the source select transistor SST and the drain select transistor DST may be connected in series to each other. Gates of the plurality of memory cells MC may be connected to the plurality of word lines WL, respectively. The memory cells MC may be programmed or read by a voltage applied to the word lines WL. A group of memory cells MC connected to the same word line WL may become a page, and the program or read operation may be performed in a page unit.

The drain select transistors DST may control an electrical connection between the plurality of memory cells MC and the bit lines BL. Gates of the drain select transistors DST may be connected to a drain select line DSL1 or DSL2. The drain select transistors DST may be turned on or turned off according to a voltage applied to the drain select line DSL1 or DSL2. For example, the first memory cell strings CS1 may be connected to the first drain select line DSL1, and the second memory cell strings CS2 may be connected to the second drain select line DSL2. Therefore, during the program or read operation, memory cell strings connected to a drain select line selected from the first and second drain select lines DSL1 and DSL2 may be selected. For example, when the first drain select line DSL1 is selected, the first memory cell strings CS1 connected to the first drain select line DSL1 may be selected.

The source select line SSL, the word lines WL, and the drain select lines DSL1 and DSL2 may extend in the first direction (X direction), and may be spaced apart from each other and stacked in the third direction (Z direction). The bit lines BL may extend in the second direction (Y direction) and may be spaced apart from each other in the first direction (X direction).

Although not shown in the drawing, the source select line SSL may also be separated like the drain select lines DSL1 and DSL2 and connected to the first and second memory cell string CS1 or CS2, respectively.

Figure 3:
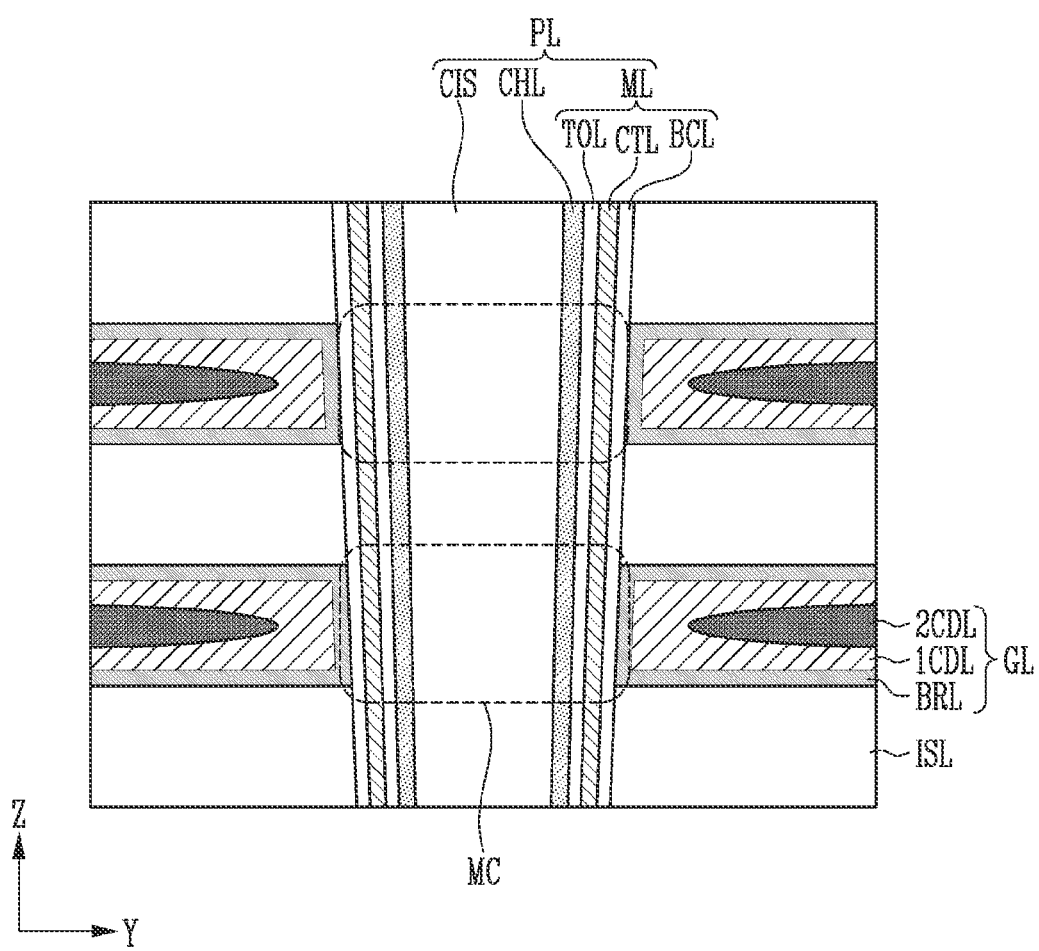
FIG. 3 is a cross-sectional view illustrating a memory device according to an embodiment of the present disclosure.

FIG. 3 is a cross-sectional view illustrating a memory device according to an embodiment of the present disclosure.

Referring to FIG. 3, the memory device may include a memory block in which data is stored, and the memory block may include a plurality of memory cells MC stacked on each other. The plurality of memory cells MC may be included in a plug PL that vertically passes through gate lines GL stacked on each other. A portion of the gate lines GL may be used as a word line and another portion may be used as a select line.

Interlayer insulation layers ISL may be formed between the gate lines GL. Therefore, the plug PL may be formed to vertically pass through the interlayer insulation layers ISL and the gate lines GL. The interlayer insulation layers ISL may be formed of an oxide layer or a silicon oxide layer. Each of the gate lines GL may include a barrier layer BRL, a first conductive layer 1CDL, and a second conductive layer 2CDL. The barrier layer BRL may be formed to prevent diffusion of an impurity between the gate lines GL and the interlayer insulation layers ISL and between the gate lines GL and the plug PL. Therefore, the barrier layer BRL may be formed to surround the first conductive layer 1CDL. The barrier layer BRL may be formed of titanium nitride (TiN).

The first conductive layer 1CDL may be formed in an area surrounded by the barrier layer BRL, and the second conductive layer 2CDL may be formed in an area surrounded by the first conductive layer 1CDL. In other words, the second conductive layer 2CDL may be filled in an empty space formed in the first conductive layer 1CDL. In the present embodiment, because the second conductive layer 2CDL is formed to fill a void, an air gap, or a seam that may be generated in the first conductive layer 1CDL during a manufacturing process of the memory device, a size of the second conductive layer 2CDL may be different according to an area of the memory block, and an area where the second conductive layer 2CDL is not formed may exist.

The second conductive layer 2CDL may be formed of a material having physical properties different from physical properties of the first conductive layer 1CDL. For example, the first conductive layer 1CDL may be formed of tungsten (W), and the second conductive layer 2CDL may be formed of molybdenum (Mo).

The plug PL may include a memory layer ML and a core insulation layer CIS. The memory layer ML may be formed in a cylindrical shape passing through the interlayer insulation layers ISL and the gate lines GL in the third direction (Z direction). The memory layer ML may include a blocking layer BCL, a charge trap layer CTL, and a tunnel insulation layer TOL. The blocking layer BCL may be formed in a cylindrical shape passing through the interlayer insulation layers ISL and the gate lines GL in the vertical direction (Z direction), and may be formed of an insulation material. For example, the blocking layer BCL may be formed of an oxide layer. The charge trap layer CTL may be formed in a cylindrical shape along an inner wall of the blocking layer BCL, and may be formed of a material capable of storing a negative charge during the program operation. For example, the charge trap layer CTL may be formed of a nitride layer. The tunnel insulation layer TOL may be formed in a cylindrical shape along an inner wall of the charge trap layer CTL. The tunnel insulation layer TOL may be formed of an insulation material, for example, an oxide layer. A channel layer CHL may be formed in a cylindrical shape along an inner wall of the tunnel insulation layer TOL, and a voltage may be applied through the bit line or the source line. For example, the channel layer CHL may be formed of a polysilicon layer. The core insulation layer CIS may be formed along an inner wall of the channel layer CHL or may be formed to fill the entire inner area. For example, the core insulation layer CIS may be formed in a cylindrical shape in an inner area of the channel layer CHL. The core insulation layer CIS may be formed of an insulation material, for example, an oxide layer.

FIGS. 4A to 4G are diagrams illustrating a method of manufacturing a memory device according to an embodiment of the present disclosure.

Figure 4A:
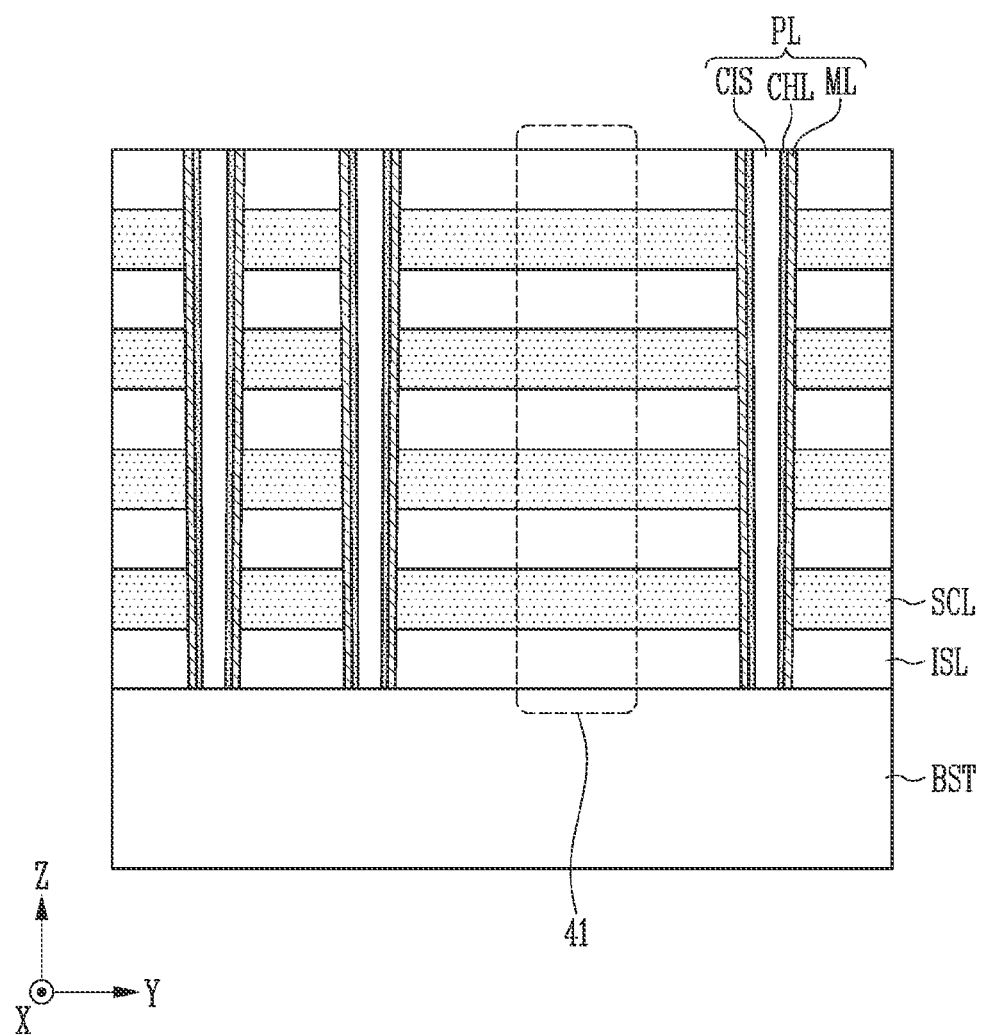
FIGS. 4A to 4G are diagrams illustrating a method of manufacturing a memory device according to an embodiment of the present disclosure.

Referring to FIG. 4A, the interlayer insulation layers ISL and the sacrificial layers SCL may be alternately stacked on a lower structure BST, and the plugs PL vertically passing though the interlayer insulation layers ISL and the sacrificial layers SCL may be formed.

The lower structure BST may be a substrate or a peripheral circuit structure formed on the substrate. The interlayer insulation layers ISL may be formed of an oxide layer, and the sacrificial layers SCL may be formed of a nitride layer.

Each of the plugs PL may include the memory layer ML, the channel layer CHL, and the core insulation layer CIS. The memory layer ML may include the blocking layer BCL, the charge trap layer CTL, and the tunnel insulation layer TOL, as described with reference to FIG. 3. The plugs PL may be spaced apart from each other at a predetermined distance, and are not formed in a slit area 41 for dividing the memory blocks. For example, the plugs PL may extend in the third direction (Z direction) to the lower structure BST and may be disposed to be spaced apart from each other along the first and second directions (X and Y directions).

Figure 4B:
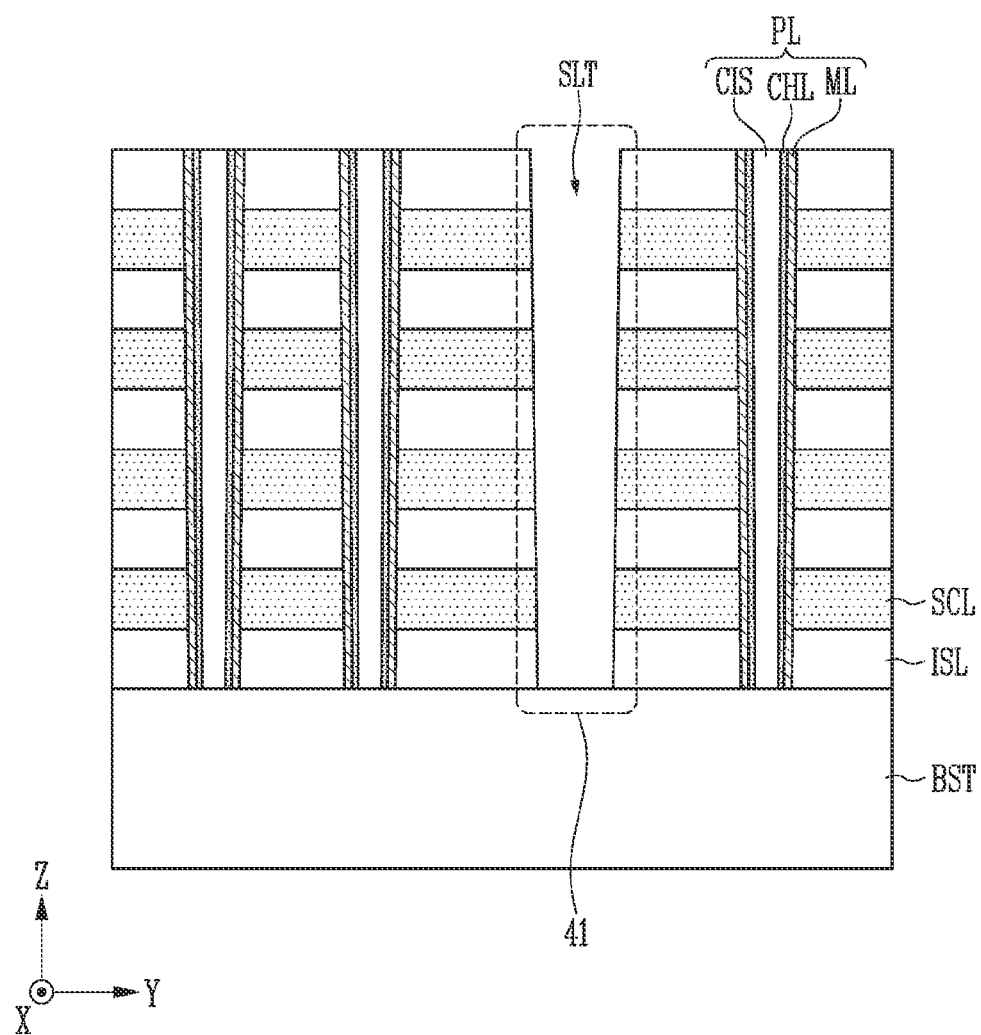

Referring to FIG. 4B, in order to form a slit SLT in the slit area 41, a step of etching a portion of the interlayer insulation layers ISL and the sacrificial layers SCL stacked on the slit area 41 may be performed. An etching process for forming the slit SLT may be performed by a dry etching process. The etching process may be performed until the lower structure BST is exposed through the slit SLT. Because the slit SLT is formed to vertically pass through the interlayer insulation layers ISL and the sacrificial layers SCL, the interlayer insulation layers ISL and the sacrificial layers SCL may be exposed through a sidewall of the slit SLT.

Figure 4C:
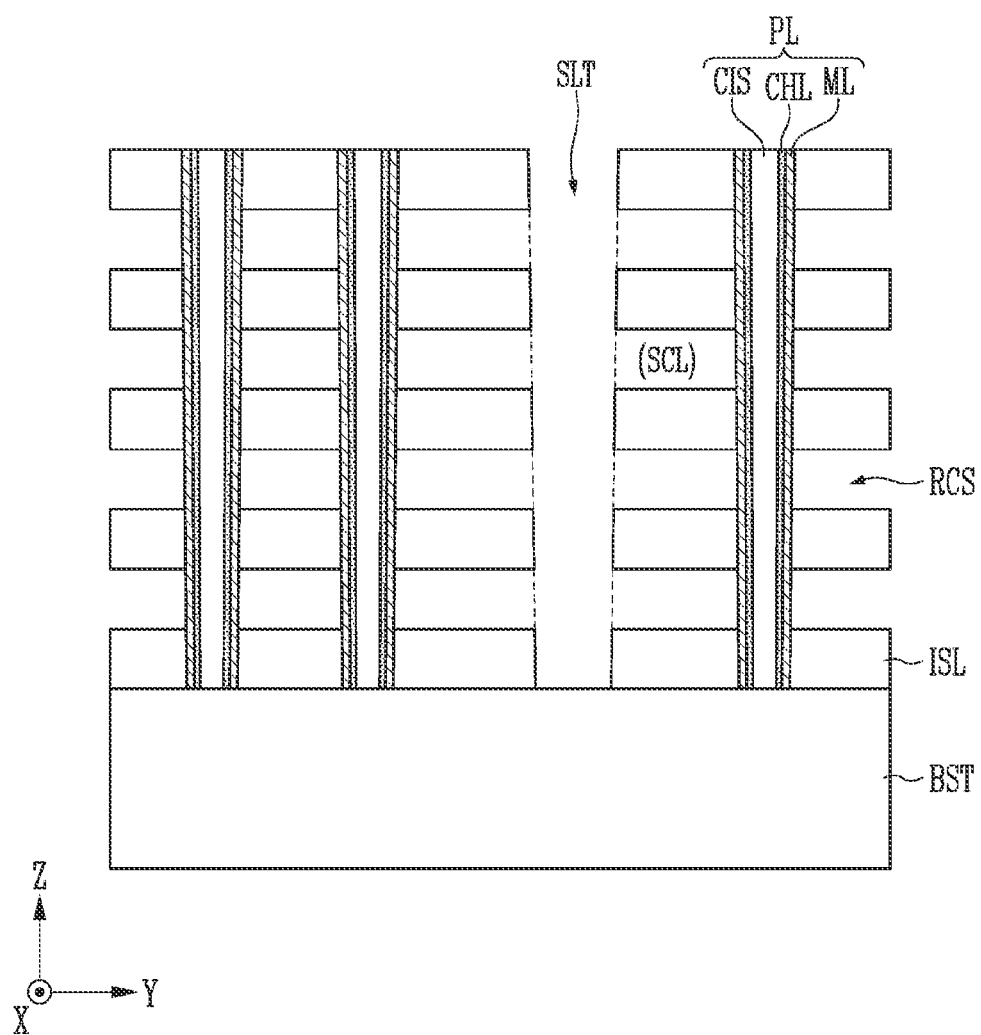

Referring to FIG. 4C, an etching process for removing the sacrificial layers SCL exposed through an inside of the slit SLT may be performed. The etching process may be performed by a wet etching process so that the sacrificial layers SCL formed between the interlayer insulation layers ISL and the plugs PL may be removed. As an etchant used in the etching process, an etchant having a higher selectivity for the sacrificial layers SCL than the interlayer insulation layers ISL, the plugs PL, and the lower structure BST may be used.

Because the etchant is supplied through the slit SLT, the sacrificial layers SCL close to the slit SLT may be etched among the sacrificial layers SCL. When the etching process is performed, because the sacrificial layers SCL between the interlayer insulation layers ISL are removed, a recess which is an empty space may be formed between the interlayer insulation layers ISL.

Figure 4D:
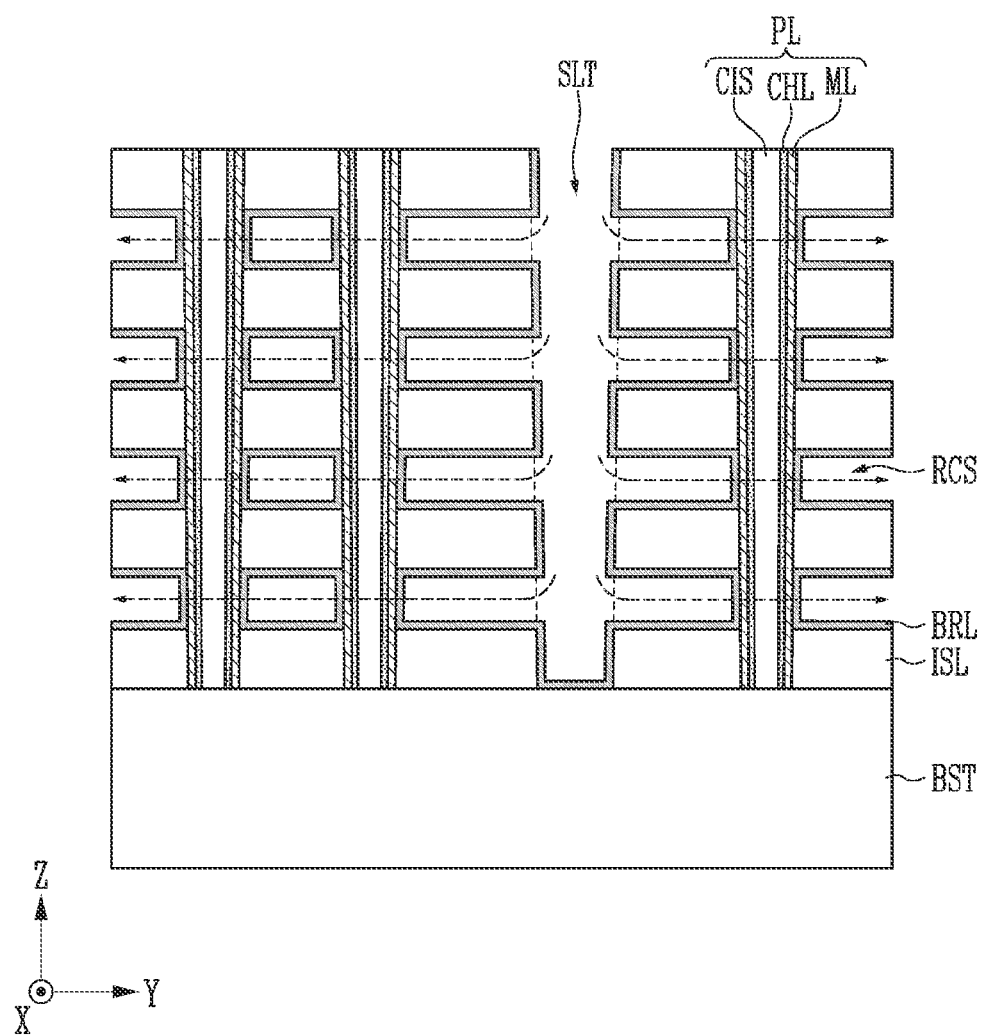

Referring to FIG. 4D, the barrier layer BRL may be formed along a surface of the entire structure exposed by removing the sacrificial layers. The barrier layer BRL may be formed to prevent diffusion of an impurity between the gate line GL and the plug PL and between the gate line GL to be formed in a subsequent process and the interlayer insulation layer ISL. A source gas for forming the barrier layer BRL may be supplied through the slit SLT. Therefore, the barrier layer BRL may be formed along a surface of the entire structure exposed through the slit SLT and the recess RCS. The barrier layer BRL may be formed of titanium nitride (TiN).

Figure 4E:
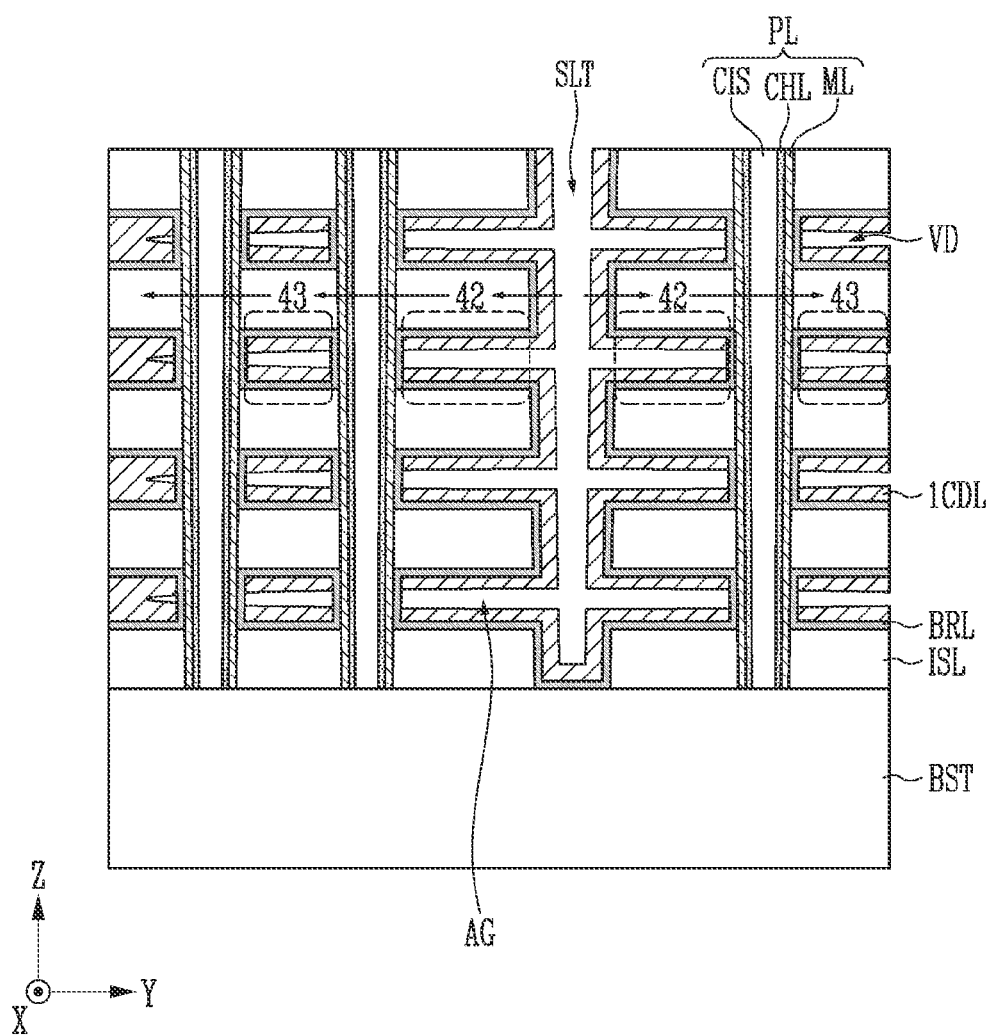

Referring to FIG. 4E, the first conductive layer 1CDL may be formed along a surface of the entire structure in which the barrier layer BRL is formed. The first conductive layer 1CDL may be formed of tungsten (W). The first conductive layer 1CDL is required to be formed to completely fill a space between the interlayer insulation layers ISL, but as a distance between the interlayer insulation layers ISL decreases, a void, an air gap, or a seam may be formed in some areas where the first conductive layer 1CDL is formed. Hereinafter, a case where a void VD is formed is described as an example.

Because the source gas for forming the first conductive layer 1CDL is supplied through the slit SLT, the first conductive layer 1CDL may be filled from an area farther from the slit SLT. Therefore, the void VD formed in an area 42 close to the slit SLT is larger than the void VD formed in an area 43 relatively far from the slit SLT. That is, a size of the void VD formed in the first conductive layer 1CDL may be increased as the void VD is close to the slit SLT and may be decreased as the void VD is far from the slit SLT. In addition, the size of the void VD may vary according to a space, a distance, or a thickness between the interlayer insulation layers ISL.

The first conductive layer 1CDL may be formed along all inner walls of the barrier layer BRL, but may be formed so that the close area 42 is not blocked in a state in which the void VD is formed in the area 43 far from the slit SLT. In other words, the first conductive layer 1CDL may be formed along all inner walls of the barrier layer BRL, and a process of forming the first conductive layer 1CDL may be stopped in a state in which all voids VD formed between the first conductive layers 1CDL are connected.

Figure 4F:
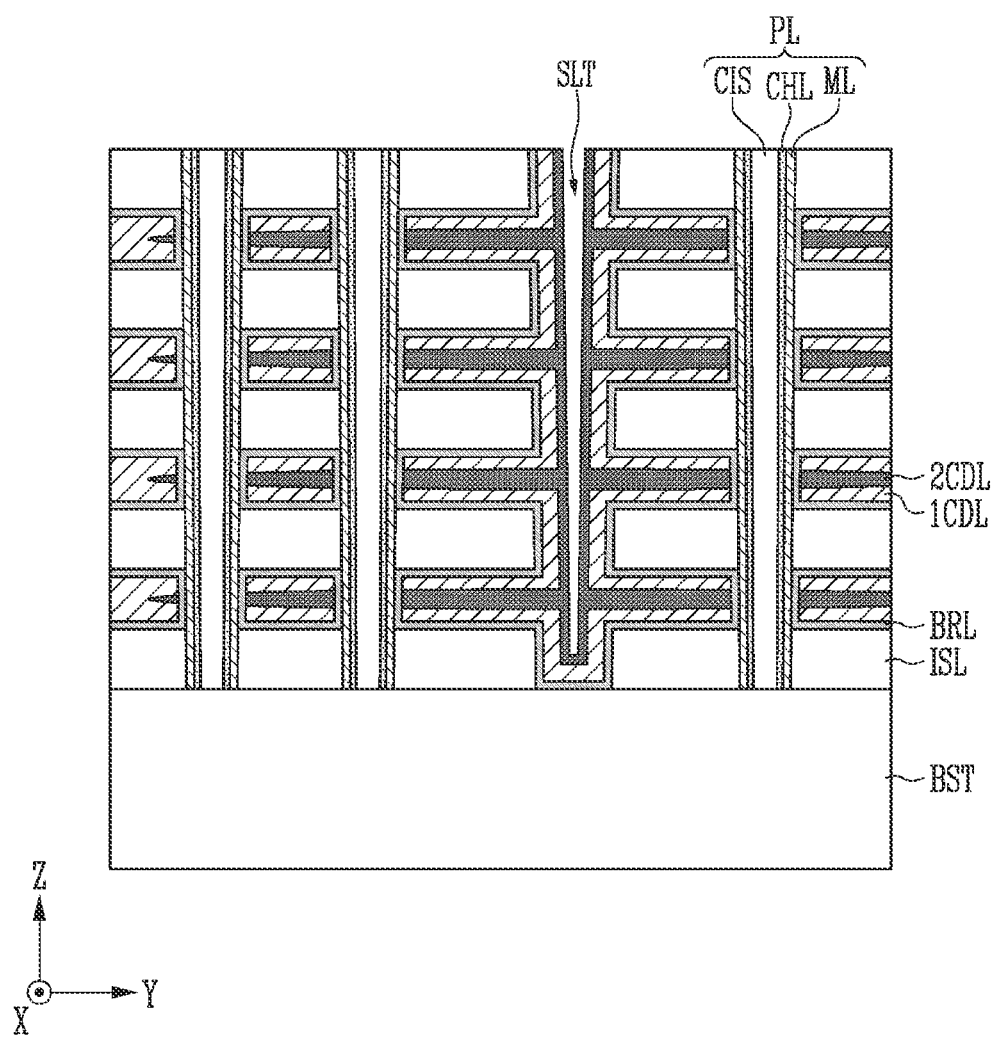

Referring to FIG. 4F, the second conductive layer 2CDL may be formed in the void VD between the first conductive layers 1CDL. The second conductive layer 2CDL may be a conductive layer formed of a material having physical properties different from physical properties of the first conductive layer 1CDL. The second conductive layer 2CDL may be formed of a material having a melting point lower than that of the first conductive layer 1CDL. For example, the second conductive layer 2CDL may be formed of molybdenum (Mo).

Because molybdenum (Mo) has a crystalline structure having a size smaller than that of tungsten (W), the void VD formed between the first conductive layers 1CDL may be filled. In addition, when a void, an air gap, or a seam is generated in the second conductive layer 2CDL after the second conductive layer 2CDL is formed, a heat treatment process may be further performed. When the heat treatment process is performed, the void, the air gap, or the seam may be removed while the second conductive layer 2CDL is recrystallized.

The second conductive layer 2CDL may be formed along an inner wall of the first conductive layer 1CDL. The second conductive layer 2CDL may be formed so that all voids VD are filled between the interlayer insulating layers ISL, but may be formed so that all slits SLT are filled or only a portion of the slits SLT are filled, in an area where the slits SLT is formed.

Figure 4G:
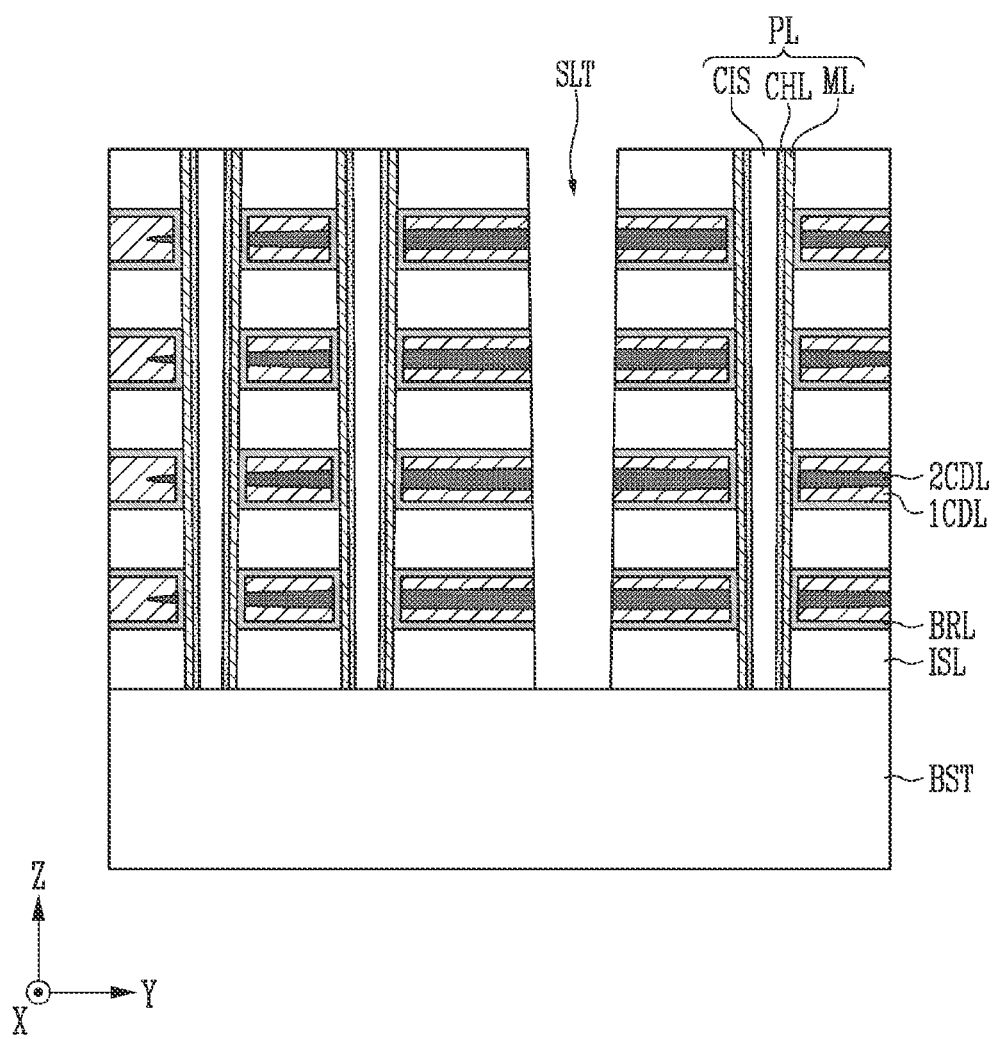

Referring to FIG. 4G, an etching process for removing the barrier layer BRL, the first conductive layer 1CDL, and the second conductive layer 2CDL formed in the slit SLT may be performed. The etching process may be performed by a dry etching process. When the barrier layer BRL, the first conductive layer 1CDL, and the second conductive layer 2CDL inside the slit SLT are removed by the etching process, the interlayer insulation layer ISL, the barrier layer BRL, the first conductive layer 1CDL, and the second conductive layer 2CDL may be exposed through a sidewall of the slit SLT. Although not shown in the drawing, a process of filling an inside of the slit SLT with an insulation layer and a conductive layer may be performed. The conductive layer filling the inside of the slit SLT may contact the source line included in the lower structure BST.

FIG. 5 is a plan view illustrating a memory device according to an embodiment of the present disclosure.

Referring to FIG. 5, the plugs PL may be formed to pass through the gate lines GL in the vertical direction (Z direction), and may be arranged in a zigzag pattern along the first and second directions (X and Y directions). The gate lines GL may include the barrier layer BRL, the first conductive layer 1CDL, and the second conductive layer 2CDL. The barrier layer BRL may be formed to have a uniform thickness along an outer wall of the plugs PL. The first conductive layer 1CDL may configure most of the gate lines GL, and the second conductive layer 2CDL may be formed in remaining areas where the barrier layer BRL and the first conductive layer 1CDL are not formed in the gate lines GL.

Because the second conductive layer 2CDL is formed by the source gas supplied through the slit SLT, the second conductive layer 2CDL may have the same size as the void formed in the gate lines GL. That is, because the void formed in the gate lines GL is filled with the second conductive layer 2CDL, the size of the second conductive layer 2CDL is increased as the second conductive layer 2CDL is close to the slit SLT and is decreased as the second conductive layer 2CDL is far from the slit SLT. In addition, the size of the second conductive layer 2CDL may be based on a thickness of the gate lines GL stacked apart from each other.

Because FIG. 5 is a diagram illustrating the size of the second conductive layer 2CDL according to a distance from the slit SLT, a shape of the second conductive layer 2CDL is not limited to a shape shown in FIG. 5, and may vary according to a shape of the void formed when the first conductive layer 1CDL is formed.

Figure 6:
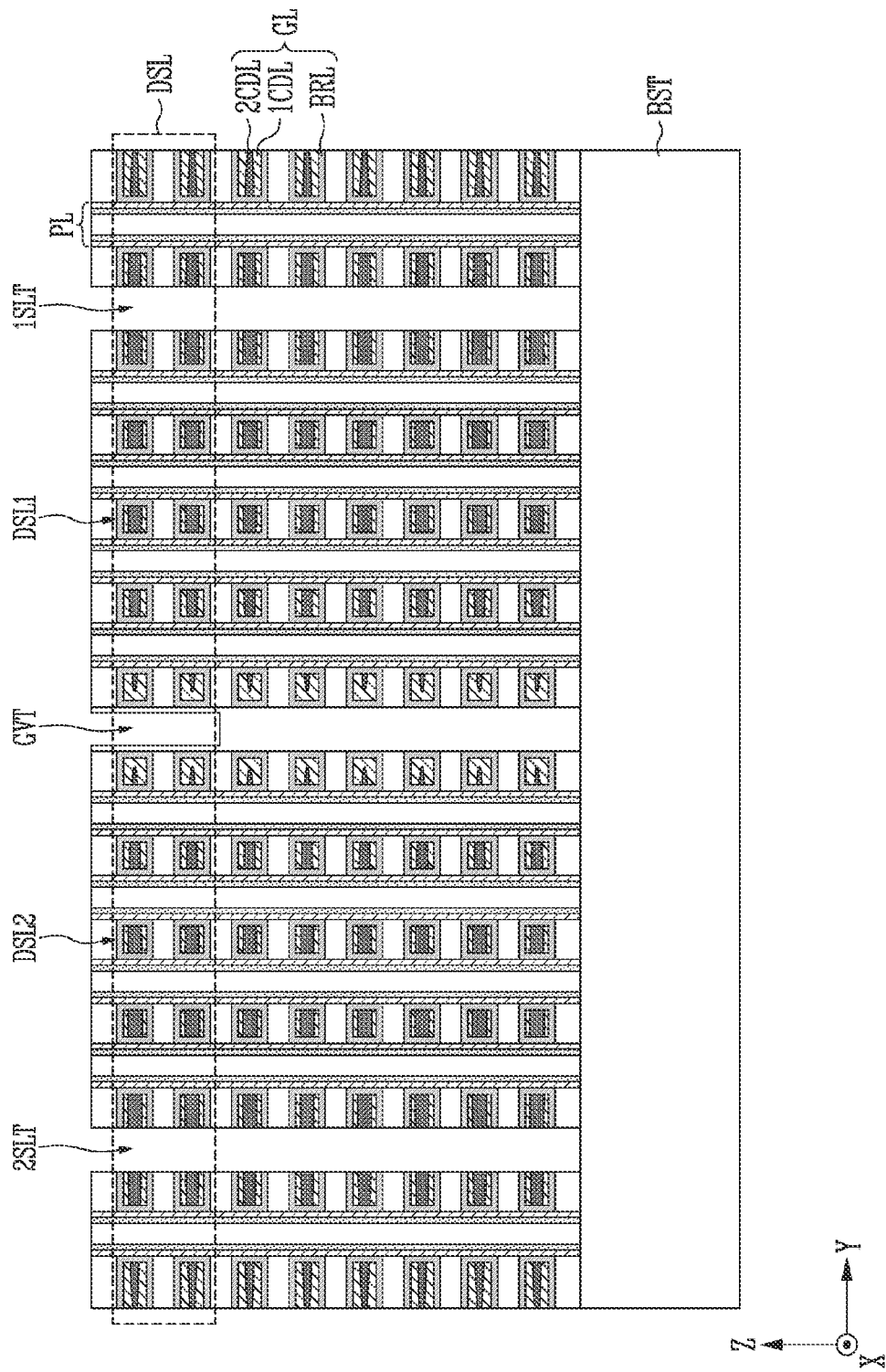
FIG. 6 is a cross-sectional view illustrating a memory device according to another embodiment of the present disclosure.

FIG. 6 is a cross-sectional view illustrating a memory device according to another embodiment of the present disclosure.

Referring to FIG. 6, as shown in FIG. 4G, after removing the barrier layer BRL, the first conductive layer 1CDL, and the second conductive layer 2CDL formed in the slit SLT, a gate separation trench GVT for separating the drain select lines DSL may be formed. For example, when first and second slits 1SLT and 2SLT are formed, the gate separation trench GVT may be formed between the first and second slits 1SLT and 2SLT. The gate separation trench GVT may be formed by etching some of the plugs PL and some of the gate lines GL. For example, the gate lines GL corresponding to the drain select line DSL may be separated from each other into first and second drain select lines DSL1 and DSL2 by the gate separation trench GVT. Because the first drain select lines DSL1 and the second drain select lines DSL2 are separated from each other by the gate separation trench GVT, different voltages may be applied to the first drain select lines DSL1 and the second drain select lines DSL2.

Also in the memory device in which the first and second slits 1SLT and 2SLT are formed, because the source gas for forming the first conductive layer 1CDL is supplied to an area between the interlayer insulation layers through the first and second slits 1SLT and 2SLT, the size of the void formed in the first conductive layer 1CDL may be large in an area adjacent to the first or second slit 1SLT or 2SLT, and may be decreased as the void is far from the first or second slits 1SLT or 2SLT. In other words, the size of the void formed in the first conductive layer 1CDL may be decreased from the first or second slit 1SLT or 2SLT to the gate separation trench GVT.

Therefore, the size of the second conductive layer 2CDL formed in the void may also be large in an area adjacent to the first or second slit 1SLT or 2SLT, and may be decreased as the void is far from the first and second slits 1SLT or 2SLT. In other words, the size of the second conductive layer 2CDL may be decreased from the first or second slit 1SLT or 2SLT to the gate separation trench GVT. In addition, the size of the second conductive layer 2CDL may be changed according to the thickness of the gate lines GL stacked apart from each other.

Figure 7:
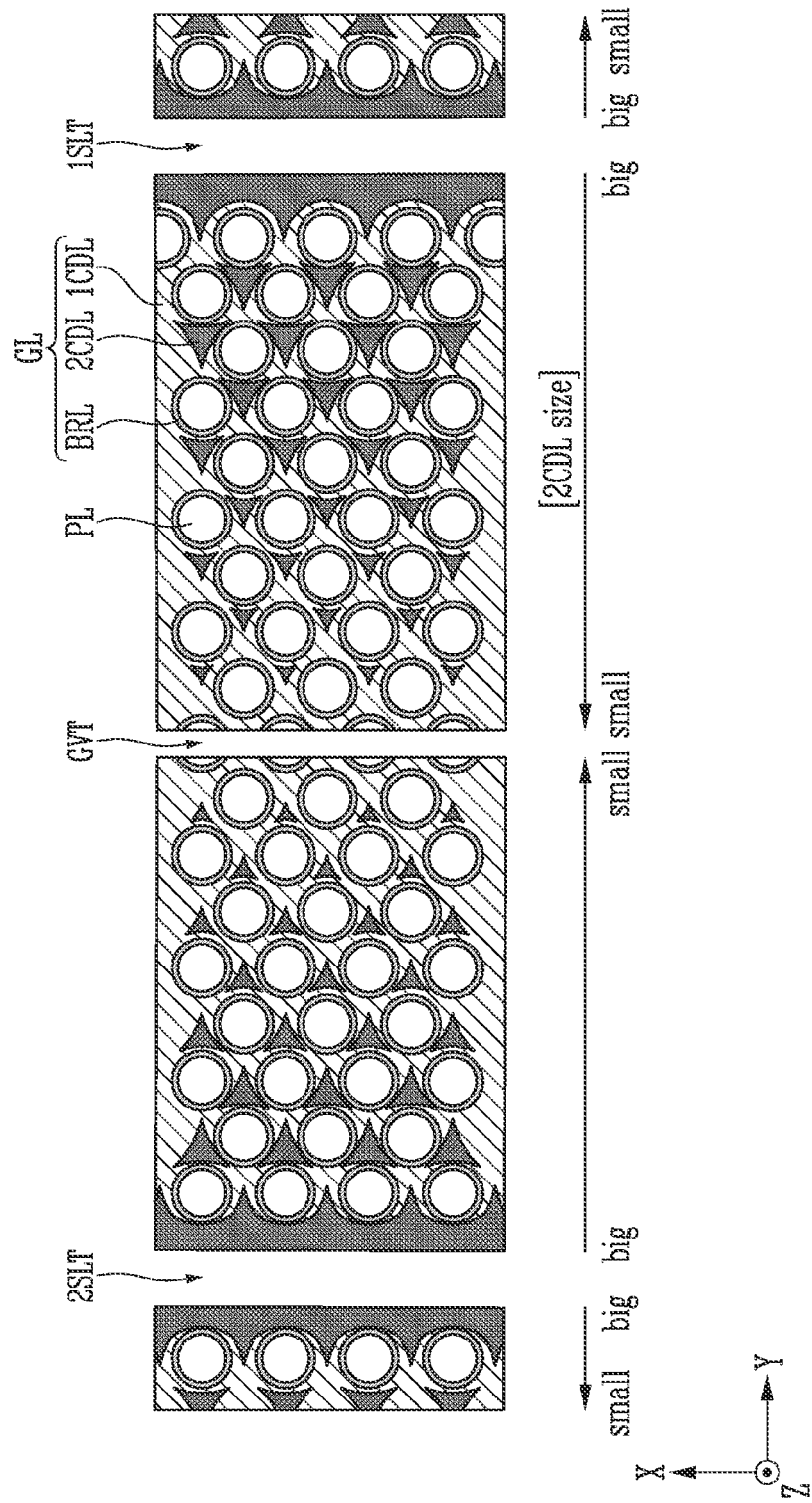
FIG. 7 is a plan view illustrating a memory device according to another embodiment of the present disclosure.

FIG. 7 is a plan view illustrating a memory device according to another embodiment of the present disclosure.

Referring to FIG. 7, the plugs PL may be formed to pass through the gate lines GL in the vertical direction (Z direction), and may be arranged in a zigzag pattern along the first and second directions (X and Y directions). The gate lines GL may include the barrier layer BRL, the first conductive layer 1CDL, and the second conductive layer 2CDL. The barrier layer BRL may be formed to have a uniform thickness along an outer wall of the plugs PL. The first conductive layer 1CDL may configure most of the gate lines GL, and the second conductive layer 2CDL may be formed in remaining areas where the barrier layer BRL and the first conductive layer 1CDL are not formed in the gate lines GL.

Because the second conductive layer 2CDL is formed by the source gas supplied through the first and second slits 1SLT and 2SLT, the second conductive layer 2CDL may have the same size as a void formed in the gate lines GL. That is, because the void formed in the gate lines GL is filled with the second conductive layer 2CDL, the size of the second conductive layer 2CDL is increased as the second conductive layer 2CDL is close to the first or second slit 1SLT or 2SLT, and is decreased as the second conductive layer 2CDL is close to the gate separation trench GVT.

Because FIG. 7 is a diagram illustrating the size of the second conductive layer 2CDL according to a distance between the first or second slit 1SLT or 2SLT and the gate separation trench GVT, the shape is not limited to a shape shown in FIG. 7 and may vary according to the shape of the void formed when the first conductive layer 1CDL is formed.

Figure 8:
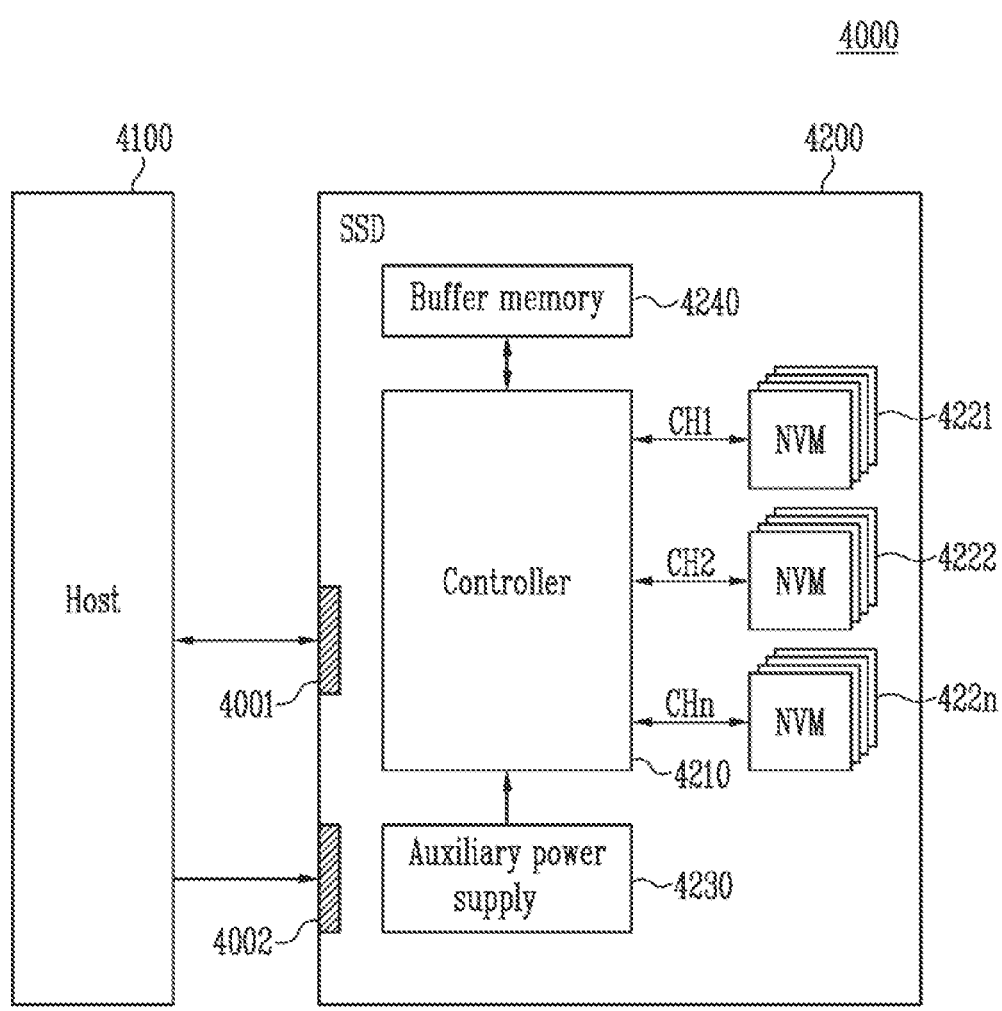
FIG. 8 is a diagram illustrating a solid state drive (SSD) system to which a memory device of the present disclosure is applied.

FIG. 8 is a diagram illustrating a solid state drive (SSD) system to which a memory device in accordance with the present disclosure is applied.

Referring to FIG. 8, the SSD system 4000 includes a host 4100 and an SSD 4200. The SSD 4200 may exchange a signal with the host 4100 through a signal connector 4001 and receive power through a power connector 4002. The SSD 4200 includes a controller 4210, a plurality of flash memories 4221 to 422n, an auxiliary power supply 4230, and a buffer memory 4240.

According to an embodiment of the present disclosure, each of the plurality of flash memories 4221 to 422n may be configured identically to the memory device 100 described with reference to FIG. 1.

The controller 4210 may control the plurality of flash memories 4221 to 422n in response to the signal received from the host 4100. For example, the signal may be based on an interface between the host 4100 and the SSD 4200. For example, the signal may be defined by at least one of multiple interfaces such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power supply 4230 may be connected to the host 4100 through the power connector 4002. The auxiliary power supply 4230 may receive a power voltage from the host 4100 and be charged by the power voltage. The auxiliary power supply 4230 may provide the power voltage to the SSD 4200 when power supply from the host 4100 is not smooth. For example, the auxiliary power supply 4230 may be positioned in the SSD 4200 or may be positioned outside the SSD 4200. For example, the auxiliary power supply 4230 may be positioned on a main board and may provide auxiliary power to the SSD 4200.

The buffer memory 4240 may be used as a buffer memory of the SSD 4200. For example, the buffer memory 4240 may temporarily store data received from the host 4100 or data received from the plurality of flash memories 4221 to 422n, or may temporarily store metadata (for example, a mapping table) of the flash memories 4221 to 422n. The buffer memory 4240 may include volatile memory such as DRAM, SDRAM, DDR SDRAM, and LPDDR SDRAM, or non-volatile memory such as FRAM, ReRAM, STT-MRAM, and PRAM.

Figure 9:
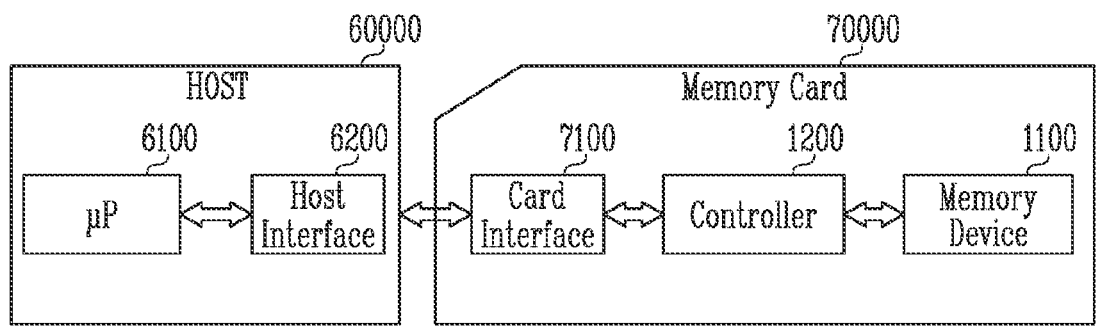
FIG. 9 is a diagram illustrating a memory card system to which a memory device of the present disclosure is applied.

FIG. 9 is a diagram illustrating a memory card system to which a memory device in accordance with the present disclosure is applied.

Referring to FIG. 9, the memory system 70000 may be implemented as a memory card or a smart card. The memory system 70000 may include a memory device 1100, a controller 1200, and a card interface 7100.

The memory device 1100 may be configured identically to the memory device 100 shown in FIG. 1.

The controller 1200 may control data exchange between the memory device 1100 and the card interface 7100. According to an embodiment, the card interface 7100 may be a secure digital (SD) card interface or a multi-media card (MMC) interface, but is not limited thereto.

The card interface 7100 may interface data exchange between a host 60000 and the controller 1200 according to a protocol of the host 60000. According to an embodiment, the card interface 7100 may support a universal serial bus (USB) protocol, and an inter chip (IC)-USB protocol. Here, the card interface 7100 may refer to hardware capable of supporting a protocol that is used by the host 60000, software installed in the hardware, or a signal transmission method.

When the memory system 70000 is connected to a host interface 6200 of the host 60000 such as a PC, a tablet PC, a digital camera, a digital audio player, a mobile phone, a console video game hardware, or a digital set-top box, the host interface 6200 may perform data communication with the memory device 1100 through the card interface 7100 and the controller 1200 under the control of a microprocessor (μP) 6100.

What is claimed is:

1. A memory device comprising:
   interlayer insulation layers spaced apart from each other and stacked;
   gate lines formed between the interlayer insulation layers; and
   a plug vertically passing through the interlayer insulation layers and the gate lines,
   wherein each of the gate lines comprises:
      a barrier layer formed along an inner wall of each of the interlayer insulation layers and the plug;
      a first conductive layer surrounded by the barrier layer; and
      a second conductive layer surrounded by the first conductive layer, wherein a material of the second conductive layer is different from a material of the first conductive layer, and wherein a size of the second conductive layer is variable along a direction in which the gate lines extend,
      wherein the material of the second conductive layer has a melting point lower than the material of the first conductive layer.

2. The memory device of claim 1, wherein the barrier layer comprises titanium nitride (TIN).

3. The memory device of claim 1, wherein the first conductive layer comprises tungsten (W).

4. The memory device of claim 1, wherein the material of the second conductive layer has a crystal structure smaller than the material of the first conductive layer.

5. The memory device of claim 1, wherein the material of the second conductive layer is recrystallized by a heat treatment process.

6. The memory device of claim 1, wherein the material of the second conductive layer comprises molybdenum (Mo).

7. The memory device of claim 1, wherein the plug comprises:
   a blocking layer vertically passing through the interlayer insulation layers and the gate lines;
   a charge trap layer formed along an inner wall of the blocking layer;
   a tunnel insulation layer formed along an inner wall of the charge trap layer;
   a channel layer formed along an inner wall of the tunnel insulation layer; and
   a core insulation layer filling a space surrounded by the channel layer.

8. A memory device comprising:
   interlayer insulation layers and gate lines alternately stacked on each other;
   plugs vertically passing through the interlayer insulation layers and the gate lines; and
   a first slit separating the interlayer insulation layers and the gate lines to separate different memory blocks,
   wherein each of the gate lines includes:
      a barrier layer;
      a first conductive layer surrounded by the barrier layer; and
      a second conductive layer surrounded by the first conductive layer, wherein a size of the second conductive layer increases with decreasing distance of the second conductive layer from the first slit,
   wherein a material of the second conductive layer has a melting point lower than a material of the first conductive layer.

9. The memory device of claim 8, wherein the first conductive layer comprises tungsten (W).

10. The memory device of claim 8, wherein the material of the second conductive layer has a crystal structure smaller than the material of the first conductive layer.

11. The memory device of claim 8, wherein the second conductive layer comprises molybdenum.

12. The memory device of claim 8, wherein the size of the second conductive layer is based on a thickness of each of the gate lines.

13. The memory device of claim 8, further comprising:
    a gate separation trench separating each of some gate lines adjacent to bit lines among the gate lines, when the plugs contact the bit lines and a source line.

14. The memory device of claim 13, wherein the gate separation trench is formed along a direction perpendicular to a direction in which the bit lines extend.

15. The memory device of claim 13, wherein the size of the second conductive layer decreases with decreasing distance to the gate separation trench.

16. The memory device of claim 8, further comprising:
    a second slit spaced apart from the first slit.

17. The memory device of claim 16, wherein the size of the second conductive layer increases with decreasing distance to the first slit or the second slit, and decreases with decreasing distance to a center between the first and second slits.

18. The memory device of claim 16, wherein the size of the second conductive layer is symmetrical with respect to a center between the first and second slits.

19. A method of manufacturing a memory device, the method comprising:
    alternately stacking interlayer insulation layers and sacrificial layers on a lower structure;
    forming plugs vertically passing through the interlayer insulation layers and the sacrificial layers;
    forming a slit vertically passing through the interlayer insulation layers and the sacrificial layers in a boundary area between different memory blocks;
    removing the sacrificial layers exposed through a sidewall of the slit;
    forming a first conductive layer in an area from which the sacrificial layers are removed; and
    filling a void generated when the first conductive layer is formed with a second conductive layer, wherein a material of the second conductive layer is different from a material of the first conductive layer,
    wherein the material of the second conductive layer has a melting point lower than the material of the first conductive layer.

20. The method of claim 19, wherein the first conductive layer comprises tungsten (W).

21. The method of claim 19, wherein the material of the second conductive layer has a crystal structure smaller than the material of the first conductive layer.

22. The method of claim 19, wherein the material of the second conductive layer is recrystallized by a heat treatment process.

23. The method of claim 19, wherein the material of the second conductive layer comprises molybdenum (Mo).

24. The method of claim 19, wherein a source gas for forming the second conductive layer is supplied through the slit.

25. The method of claim 19, further comprising:
    performing a heat treatment process to further deform a crystal structure of the second conductive layer to a smaller size, after filling the void generated when the first conductive layer is formed with the second conductive layer.

\* \* \* \* \*